US010483455B2

(12) United States Patent
Nikonov et al.

(10) Patent No.: US 10,483,455 B2
(45) Date of Patent: Nov. 19, 2019

(54) MAGNETIC ELEMENT FOR MEMORY AND LOGIC (71) Applicant: Intel Corporation, Santa Clara, CA (US)

(72) Inventors: Dmitri E. Nikonov, Beaverton, OR (US); Ian A. Young, Portland, OR (US)

(73) Assignee: Intel Corporation, Santa Clara, CA (US)

(*) Notice: Subject to any disclaimer, the term of this patent is extended or adjusted under 35 U.S.C. 154(b) by 310 days.

(21) Appl. No.: 14/778,704

(22) PCT Filed: Jun. 29, 2013

(86) PCT No.: PCT/US2013/048790
§ 371 (c)(1),
(2) Date: Sep. 21, 2015

(87) PCT Pub. No.: WO2014/209402
PCT Pub. Date: Dec. 31, 2014

(65) Prior Publication Data
US 2016/0049580 A1 Feb. 18, 2016

(51) Int. Cl.
H01L 29/82 (2006.01)
H01L 43/02 (2006.01)
(Continued)

(52) U.S. Cl.
CPC ............ *H01L 43/02* (2013.01); *G11C 11/161* (2013.01); *H01L 43/08* (2013.01); *H01L 43/12* (2013.01)

(58) Field of Classification Search
CPC ..... G11C 11/15; G11C 11/161; H01L 27/228; H01L 43/08; H01L 43/12; H01L 43/02; B82Y 25/00
(Continued)

(56) References Cited

U.S. PATENT DOCUMENTS 6,005,800 A * 12/1999 Koch ................ G11C 11/16
365/173
6,021,065 A * 2/2000 Daughton ............ B82Y 10/00
257/E27.005
(Continued)

FOREIGN PATENT DOCUMENTS

KR 10-2005-0101461 10/2005

OTHER PUBLICATIONS

International Searching Authority, "Notification of Transmittal of the International Search Report," dated Mar. 27, 2014, in International application No. PCT/US2013/048790.
(Continued)

Primary Examiner — Jami Valentine Miller
(74) Attorney, Agent, or Firm — Trop, Pruner & Hu, P.C.

(57) ABSTRACT

An embodiment includes a magnetic tunnel junction (MTJ) having a non-elliptical free layer with rounded corners. For example, an embodiment includes a MTJ including a free magnetic layer, a fixed magnetic layer, and a tunnel barrier between the free and fixed layers; wherein the free magnetic layer includes a top surface, a bottom surface, and a sidewall circumnavigating the free magnetic layer and coupling the bottom surface to the top surface; wherein the top surface is rectangular with a plurality of rounded corners. In an embodiment, the aspect ratio of the top surface is between 4:1 and 8:1 (length to width). Such an embodiment provides ease of manufacture along with accept critical switching current (to reverse polarity of the free layer) and stability. Other embodiments are described herein.

18 Claims, 7 Drawing Sheets (51) Int. Cl.
*H01L 43/08* (2006.01)
*H01L 43/12* (2006.01)
*G11C 11/16* (2006.01)

(58) Field of Classification Search
USPC .......................................................... 257/421
See application file for complete search history.

(56) References Cited

U.S. PATENT DOCUMENTS

| | | | | |
|---|---|---|---|---|
| 6,052,302 A * | 4/2000 | Moyer | ................... | G11C 11/16 365/158 |
| 6,104,633 A * | 8/2000 | Abraham | ................ | G11C 11/15 257/E27.005 |
| 6,605,836 B2 * | 8/2003 | Kishi | ...................... | B82Y 10/00 257/295 |
| 6,717,845 B2 * | 4/2004 | Saito | ........................ | G11C 11/16 365/158 |
| 6,795,335 B2 * | 9/2004 | Hidaka | ................... | G11C 5/063 365/158 |
| 6,949,779 B2 * | 9/2005 | Kai | ........................... | G11C 11/15 257/295 |
| 6,956,270 B2 * | 10/2005 | Fukuzumi | ............... | G11C 11/15 257/421 |
| 7,005,691 B2 * | 2/2006 | Odagawa | .............. | B82Y 10/00 257/295 |
| 7,245,524 B2 * | 7/2007 | Yoda | ........................ | G11C 11/16 365/158 |
| 7,326,982 B2 * | 2/2008 | Iwata | ....................... | B82Y 10/00 257/295 |
| 7,411,263 B2 * | 8/2008 | Nakayama | ............ | B82Y 10/00 257/295 |
| 7,521,743 B2 * | 4/2009 | Yamagishi | ............. | B82Y 10/00 257/295 |
| 7,580,228 B1 * | 8/2009 | Lauer | ...................... | B82Y 10/00 324/207.21 |
| 7,599,156 B2 * | 10/2009 | Kishi | ...................... | G11C 11/15 360/324.11 |
| 7,796,428 B2 * | 9/2010 | Redon | ..................... | G11C 11/16 365/158 |
| 7,816,727 B2 * | 10/2010 | Lai | ............................ | G11C 8/10 257/324 |
| 8,009,465 B2 * | 8/2011 | Nakayama | .............. | H01L 43/08 257/295 |
| 8,159,018 B2 * | 4/2012 | Akil | .................. | H01L 21/28282 257/324 |
| 8,518,562 B2 * | 8/2013 | Takenaga | ................. | G11B 5/66 257/20 |
| 2006/0181813 A1 * | 8/2006 | Fukuzumi | ............... | G11C 11/15 360/324 |
| 2008/0258721 A1 * | 10/2008 | Guo | ....................... | B82Y 25/00 324/252 |
| 2010/0258887 A1 | 10/2010 | Xiaochun et al. | | |
| 2011/0233697 A1 * | 9/2011 | Kajiyama | ............. | H01L 27/228 257/421 |
| 2012/0008367 A1 * | 1/2012 | Kajiyama | ............. | H01L 27/228 365/148 |
| 2016/0049580 A1 * | 2/2016 | Nikonov | .................. | H01L 43/12 257/421 |

OTHER PUBLICATIONS

Taiwan Intellectual Property Office, Office Action dated Mar. 21, 2016 in Taiwanese Patent Application No. 103120502.
State Intellectual Property Office of the People's Republic of China, Second Office Action dated Jan. 24, 2018 in Chinese Patent Application No. 201380077021.7.
MITS Electronics, "About the minimum width of milling", http://www.mitspcb.com/edoc/minimum_a.htm.
State Intellectual Property Office of the People's Republic of China, First Office Action dated Jul. 21, 2017, in Chinese Patent Application No. 201380077021.7.
Indonesia Patent Office, First Office Action dated Jul. 11, 2017, in Indonesian Patent Application No. P-00201507868.

* cited by examiner

MAGNETIC ELEMENT FOR MEMORY AND LOGIC

TECHNICAL FIELD

Embodiments of the invention are in the field of semiconductor devices and, in particular, magnet based memory.

BACKGROUND

Figure 1:
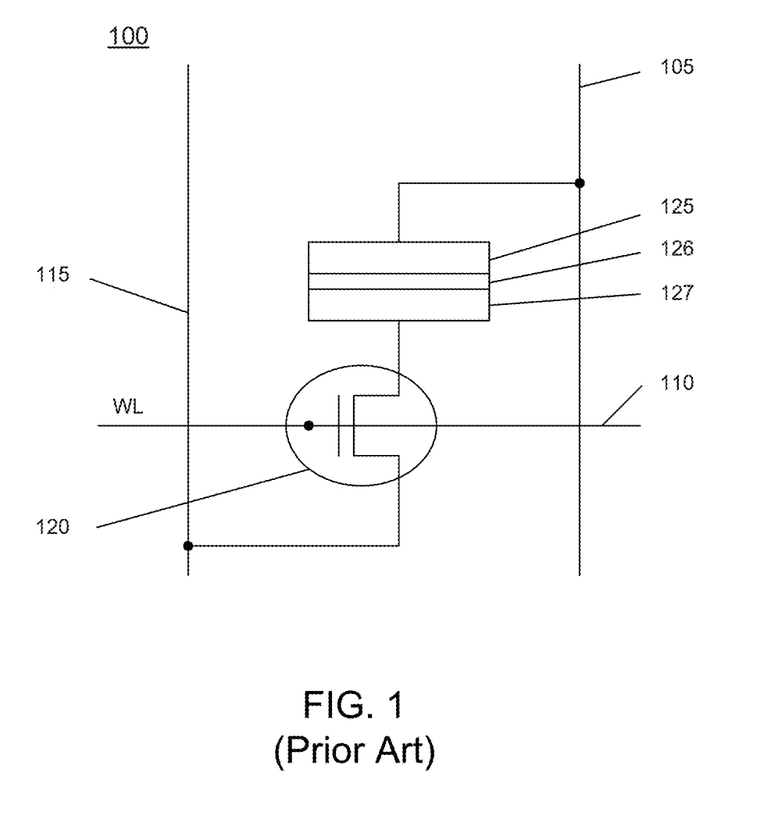
FIG. 1 depicts a conventional magnetic memory cell.

Some magnetic memories, such as a spin transfer torque memory (STTM), utilize a magnetic tunnel junction (MTJ) for switching and detection of the memory's magnetic state. FIG. 1 includes spin transfer torque random access memory (STTRAM), a form of STTM. FIG. 1 includes a MTJ consisting of ferromagnetic (FM) layers 125, 127 and tunneling barrier 126 (e.g., magnesium oxide (MgO)). The MTJ couples bit line (BL) 105 to selection switch 120 (e.g., transistor), word line (WL) 110, and sense line (SL) 115. Memory 100 is "read" by assessing the change of resistance (e.g., tunneling magnetoresistance (TMR)) for different relative magnetizations of FM layers 125, 127.

More specifically, MTJ resistance is determined by the relative magnetization directions of layers 125, 127. When the magnetization directions between the two layers are anti-parallel, the MTJ is in a high resistance state. When the magnetization directions between the two layers are parallel, the MTJ is in a low resistance state. Layer 127 is the "reference layer" or "fixed layer" because its magnetization direction is fixed. Layer 125 is the "free layer" because its magnetization direction is changed by passing a driving current polarized by the reference layer (e.g., a positive voltage applied to layer 127 rotates the magnetization direction of layer 125 opposite to that of layer 127 and negative voltage applied to layer 127 rotates the magnetization direction of layer 125 to the same direction of layer 127).

BRIEF DESCRIPTION OF THE DRAWINGS

Features and advantages of embodiments of the present invention will become apparent from the appended claims, the following detailed description of one or more example embodiments, and the corresponding figures, in which:

DETAILED DESCRIPTION

Reference will now be made to the drawings wherein like structures may be provided with like suffix reference designations. In order to show the structures of various embodiments more clearly, the drawings included herein are diagrammatic representations of integrated circuit structures. Thus, the actual appearance of the fabricated integrated circuit structures, for example in a photomicrograph, may appear different while still incorporating the claimed structures of the illustrated embodiments. Moreover, the drawings may only show the structures useful to understand the illustrated embodiments. Additional structures known in the art may not have been included to maintain the clarity of the drawings. "An embodiment", "various embodiments" and the like indicate embodiment(s) so described may include particular features, structures, or characteristics, but not every embodiment necessarily includes the particular features, structures, or characteristics. Some embodiments may have some, all, or none of the features described for other embodiments. "First", "second", "third" and the like describe a common object and indicate different instances of like objects are being referred to. Such adjectives do not imply objects so described must be in a given sequence, either temporally, spatially, in ranking, or in any other manner. "Connected" may indicate elements are in direct physical or electrical contact with each other and "coupled" may indicate elements co-operate or interact with each other, but they may or may not be in direct physical or electrical contact. Also, while similar or same numbers may be used to designate same or similar parts in different figures, doing so does not mean all figures including similar or same numbers constitute a single or same embodiment.

STTRAM, described above, is just one example of "beyond CMOS" technology (or "non-CMOS based" technology), which relates to devices and processes not entirely implemented with complementary metal-oxide-semiconductor (CMOS) techniques. Beyond CMOS technology may rely on spin polarization (which concerns the degree to which the spin or intrinsic angular momentum of elementary particles is aligned with a given direction) and, more generally, spintronics (a branch of electronics concerning the intrinsic spin of an electron, its associated magnetic moment, and the electron's fundamental electronic charge). Spintronics devices may concern TMR, which uses quantum-mechanical tunneling of electrons through a thin insulator to separate ferromagnetic layers, and STT, where a current of spin polarized electrons may be used to control the magnetization direction of ferromagnetic electrodes.

Beyond CMOS devices include, for example, spintronic devices implemented in memory (e.g., 3 terminal STTRAM), spin logic devices (e.g., logic gates), tunnel field-effect transistors (TFETs), impact ionization MOS (IMOS) devices, nano-electro-mechanical switches (NEMS), negative common gate FETs, resonant tunneling diodes (RTD), single electron transistors (SET), spin FETs, nanomagnet logic (NML), domain wall logic, domain wall memory, and the like. While various embodiments herein discuss memory, other embodiments are not so limited and may be included in the aforementioned technologies.

Thus, magnets play a major role in many technologies described above. However, practical implementation of magnets in semiconductor devices can be difficult. For example, efficient mask layout, lithography, and patterning of nanomagnets for STTRAM is particularly problematic. Some of this difficulty is based on the perceived need for the shape of the nanomagnet magnetic element to be elliptic (which provides stability to magnet states so the elliptical magnet does not inadvertently flip/transform its magnetic orientation, due to, for example, thermal noise, into other magnetization states, such as C and S states that are discussed). However, an ellipse (due to its rounded edges) is difficult to produce by modern lithography based on periodic arrays of parallel lines.

More specifically, a special mask allowing non-orthogonal shapes is needed for patterning elliptical shapes. Consequently, modern lithography techniques that use a periodic grid of parallel lines and pitch-halving are not suitable for elliptical shapes. As a result, elliptical shapes do not use pitch-halving and the like and are consequently not formed at the critical dimension available in microprocessor lithography (a critical dimension includes dimensions of the smallest geometrical features, such as the width of interconnect lines, contacts, trenches, and the like, which can be formed during semiconductor device/circuit manufacturing using a given technology, such as 45 nm lithography). So when elliptical nanomagnets are made, they are produced as large nanomagnets (not formed at the critical dimension), which require large current for switching the polarization of the magnet (such as changing the orientation of the free layer magnet). This makes elliptical memory based STTRAM non-competitive with other types of memory.

Figure 3:
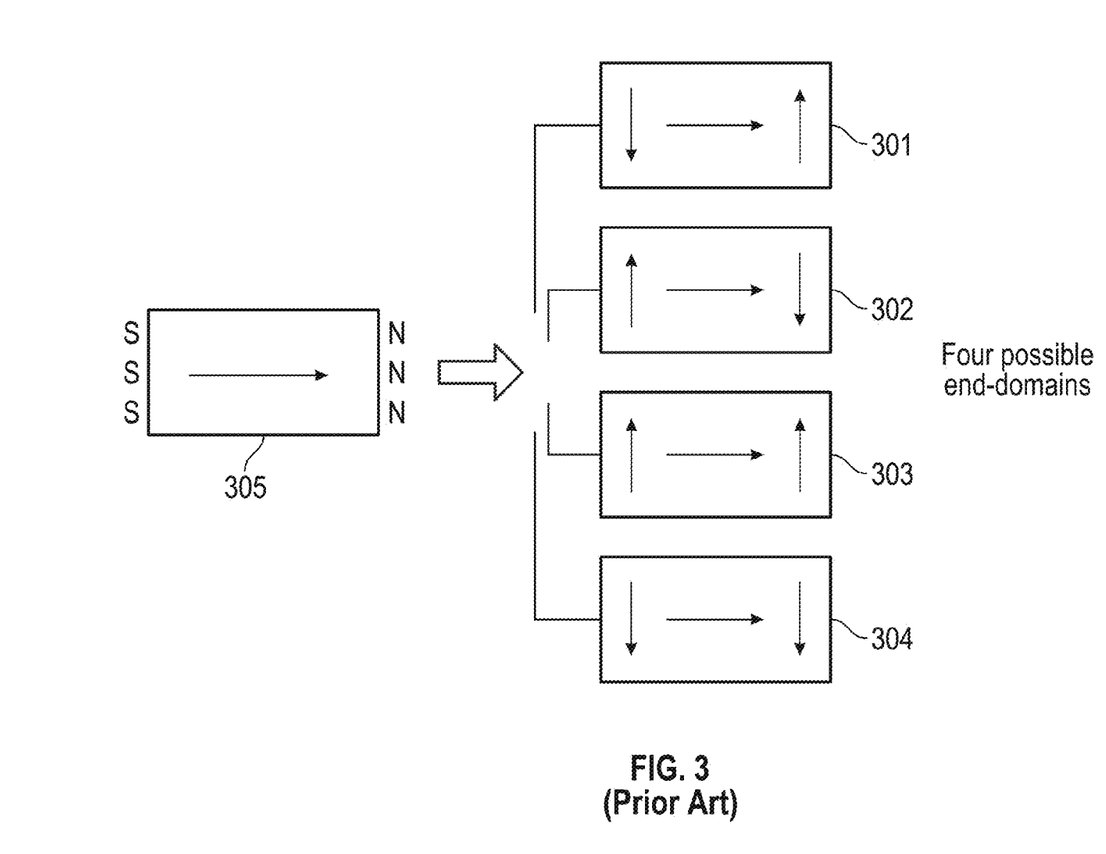
FIG. 3 addresses C and S states in magnetic free layers.

While an elliptical free layer is problematic (see above), ellipses are not the only problematic shape. For example, a rectangular shaped free layer with four 90 degree corners has numerous problems. First, such a free layer with close to ideal "sharp corners" may require 6 lithography masks or more to manufacture the device. Second, conventional norms dictate rectangular magnets will not suffice for free layers in a MTJ because they are not stable. Specifically, rectangular free layers are believed to be unable to produce definitive states of magnetization along the long axis of the rectangle (unlike an ellipse which does produce one unique definitive state of magnetization along its long axis). Conventional norms hold that rectangular shapes suffer from spurious states. Such states have magnetization that bend near the free layer edges forming so-called "C-states" and "S-states". FIG. 3 shows rectangular free layer 305 of a MTJ. "S states" exist in instances 301 (where one polarity of charges forms atop the left most arrow and opposite polarity charges gather atop the right most arrow to form a "S" shape) and 302 (where one polarity of charges forms at the bottom of the left most arrow and opposite polarity charges gather at the bottom of the right most arrow to form a "S" shape). "C-states" exist in instances 303 (where one polarity of charges forms atop the left most arrow and opposite polarity charges gather at the bottom of the right most arrow to form an "C" shape) and 304 (where one polarity of charges forms atop the left most arrow and opposite polarity charges gather at the bottom of the right most arrow to form an "C" shape). These unstable states would lead to loss of data fidelity (e.g., where a MTJ stores a "1" but due to instability "flips" to a "0").

However, an embodiment includes a magnetic tunnel junction (MTJ) having a non-elliptical free layer with rounded corners. For example, an embodiment includes a MTJ including a free magnetic layer, a fixed magnetic layer, and a tunnel barrier between the free and fixed layers; wherein the free magnetic layer includes a top surface, a bottom surface, and a sidewall circumnavigating the free magnetic layer and coupling the bottom surface to the top surface; wherein the top surface is rectangular with a plurality of rounded corners. In an embodiment, the aspect ratio of the top surface is between 4:1 and 8:1 (length to width). Such an embodiment provides ease of manufacture along with acceptable critical switching current (to reverse polarity of the free layer) and stability. Other embodiments are described herein.

Figure 4:
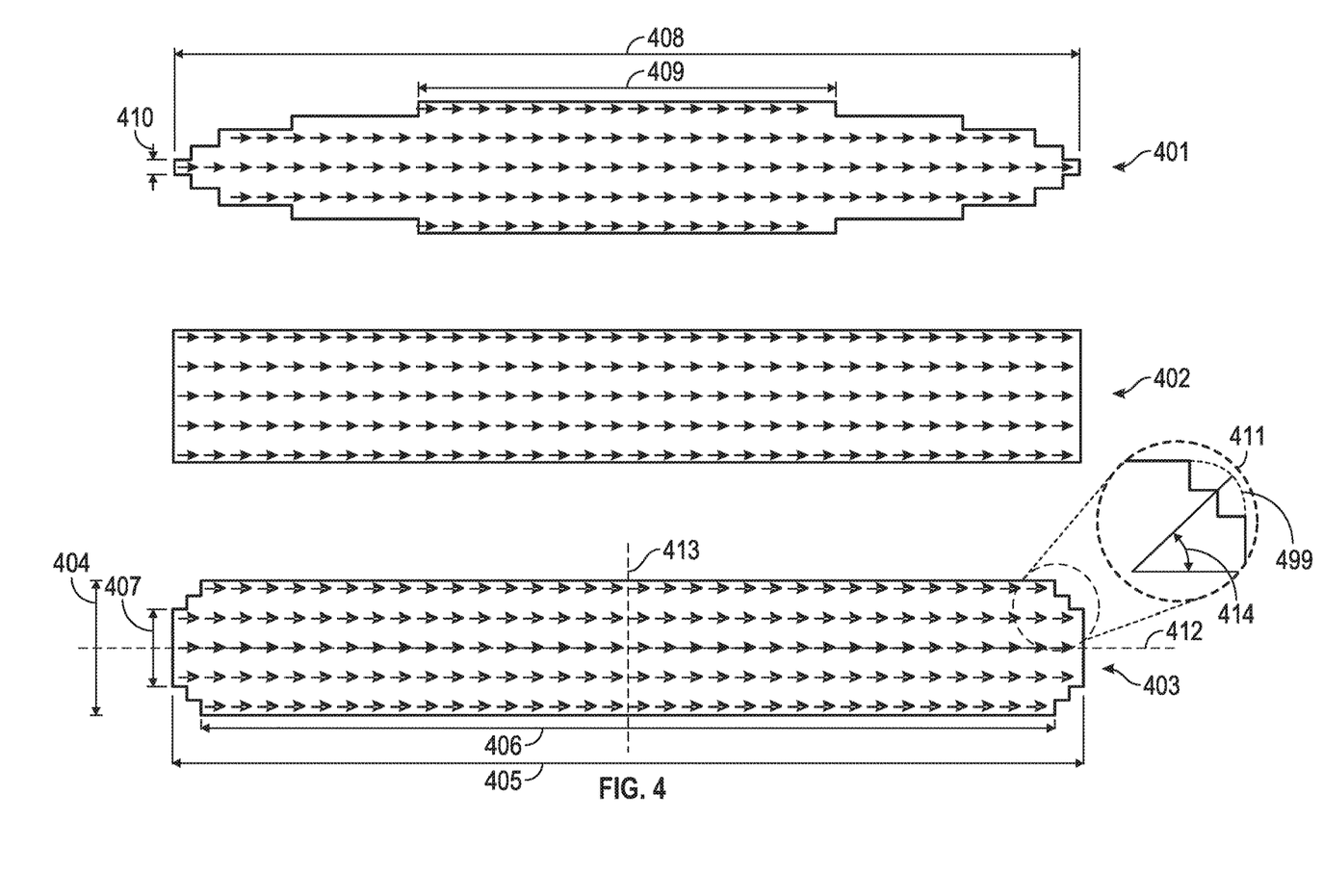
FIG. 4 includes various magnet profiles in embodiments of the invention.

For example, FIG. 4 includes various magnet profiles in embodiments of the invention. Free layer magnet profile 401 is generally elliptical. As used herein, elliptical refers to a closed curve, one of the conic sections of analytic geometry, consisting of all points whose distances from each of two fixed points (foci) add up to the same value. The midpoint between the foci is the center. Also, an "ellipse" and other shapes addressed herein are to be understood in the context of lithography where a "curve" may be comprised of a series of stair-step cuts or jogs that collectively more or less form a curve. Profile 401 is a "top view" of the free magnet layer and includes a magnet length 408 (and a width would extend from the side that defines length 409 to its opposing/opposite side). Elliptical profile 401 is not perfectly smooth about its entire circumference (as would be the case with a traditional ellipse taken in a mathematical or geometric context instead of a photolithography context). For example, one edge or side may include a linear (non-curved) portion, such as portion 409 or the portion that defines distance 410. While this shape may produce acceptable critical current and stability for a free layer, manufacturing such a shaped layer is problematic as described above.

Profile 402 is purely rectangular (i.e., a parallelogram all of whose angles are right angles and with adjacent sides of unequal length) and is problematic due to both stability (C and S states) and manufacturing (excess number of masks need for its manufacture).

Profile 403, however, includes a profile that can be manufactured using as few as 2 masks and which also provides acceptable stability and switching current. Profile 403 is a "top view" of the free magnet layer and includes a magnet length 405 and width 404. Profile 403 ("rectangular with rounded corners") includes edges or sides with linear (non-curved) portions, such as portions 406, 407. The aspect ratio (length:width) of portion 405: portion 404 is between 6:1 and 7:1. However, other embodiments are not so limited and may include aspect ratios of 2:1, 3:1, 4:1, 5:1, 8:1, 9:1 and the like. Thus, a combination of a rectangular free layer with rounded corners (for ease of manufacturing and acceptable critical current) and certain aspect ratio (to foster magnetic state stability) provides an embodiment with advantages over conventional MTJs.

Further, corner or curved portion 411 couples a "long side" (such as side defined by length 406) to a "short side" (such as side defined by distance 407). The curved portion may include a consistent radius of curvature (i.e., the radius of curvature, R, of a curve at a point on that curve is a measure of the radius of the circular arc which best approximates the curve at that point) or a varying radius of curvature. Angle 414 corresponds to a radius of curvature at one point of corner 411. (Please note the elements within area 411 are not drawn to scale.) Angle 414 is between/directly connected to a horizontal side/line and a non-horizontal line that connects to a curved dashed line 499. The curved dashed line 499 is the corner or curve to which the radius of curvature should be calculated (i.e., radius of curvature of the dashed curve 499 is a measure of the radius of the circular arc which best approximates the dashed curve 499—the actual radius is not illustrated in FIG. 4). Embodiments may have corners that include a radius of curvature such as 3, 6, 9, 12, 15, 18, 21 nm and the like.

Figure 2:
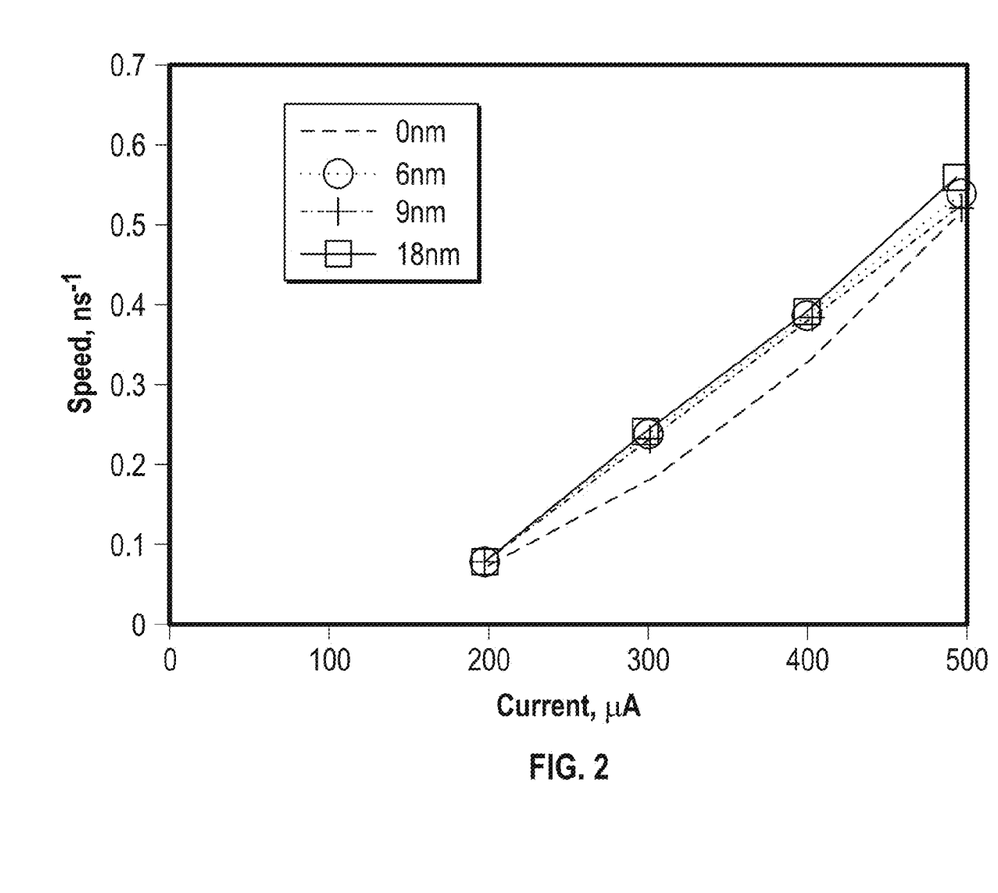
FIG. 2 addresses free layer switching time and radius of curvature in an embodiment of the invention.

FIG. 2 illustrates how for a given current across a free layer, the switch speed for switching polarity of the free layer (where switch speed increases as one goes up the Y axis of FIG. 2) is relatively consistent for radii of curvature of 6, 9, and 18 nm. Therefore an embodiment can include rounded corners that are not elliptical but also not rectangular. Such an embodiment provides acceptable stability (i.e., definite states of magnetization along the long axis 412 of the magnet, which is orthogonal to short axis 413 of the magnet) and switching current (like an ellipse) and manufacturability (e.g., like a rectangle) using only two masks (which results in dramatic cost savings on the mask set vs. a 6 mask set needed for a "pure" rectangle that includes 90 degree corners).

By avoiding an ellipse that requires a special mask for non-orthogonal shapes, modern lithography techniques using, for example, a periodic grid of parallel lines and pitch-halving may be used. Thus, dimensions for profile 403, such as width 404, may be formed at the critical dimension of the device or package that includes the device. For example, an interconnect such as a word line in FIG. 1 may be formed with a width equal to that of width 404 (i.e., both formed at critical dimension). As another example, selection switch 120 in FIG. 1 may be formed as a "finFET" with a fin having the same width as width 404 (i.e., both formed at critical dimension).

A finFET is formed around a thin strip of semiconductor material (referred to as the "fin"). The fin may be formed from the substrate. The transistor includes FET nodes: a gate, gate dielectric, and source and drain regions. A conductive channel of the finFET resides on the outer sides of the fin beneath the gate dielectric. Current runs along both "sidewalls" of the fin as well as along the top side of fin. Because the conductive channel essentially resides along the three different outer, planar regions of the fin, the particular finFET of FIG. 1 is typically referred to as a "tri-gate" finFET. Other types of finFETs exist (such as "double-gate" finFETs, which are included in other embodiments and in which the conductive channel principally resides only along both sidewalls of the fin and not along the top side of the fin).

With a general background about finFETs in mind, an embodiment of the invention may include a finFET in a memory cell including a MTJ having a free layer as described herein. For example, switch 120 of FIG. 1 may be a finFET coupled to a free layer (like layer 127) patterned as described in various embodiments addressed herein. Unlike conventional memory cells that may include an elliptical free layer (that is large and has a large switching current), an embodiment includes a free layer having a width 404 formed at the same width as that of a fin in a finFET switching device for the memory cell. This "critical dimension" that equals the fin width and width 404 may be formed based on half-pitching techniques, double patterning techniques, and/or self-aligned spacer techniques that will provide for a low die real estate, low switching current embodiment.

Self-aligned spacer techniques concern a spacer, which is a film layer formed on the sidewall of a pre-patterned feature. A spacer is formed by deposition or reaction of the film on the previous pattern, followed by etching to remove the film material on the horizontal surfaces, leaving only the material on the sidewalls. By removing the original patterned feature only the spacer is left. However, since there are two spacers for every line, the line density doubles. This allows features, such as fins and width 404, to be formed at half the original lithographic pitch, for example.

Figure 5:
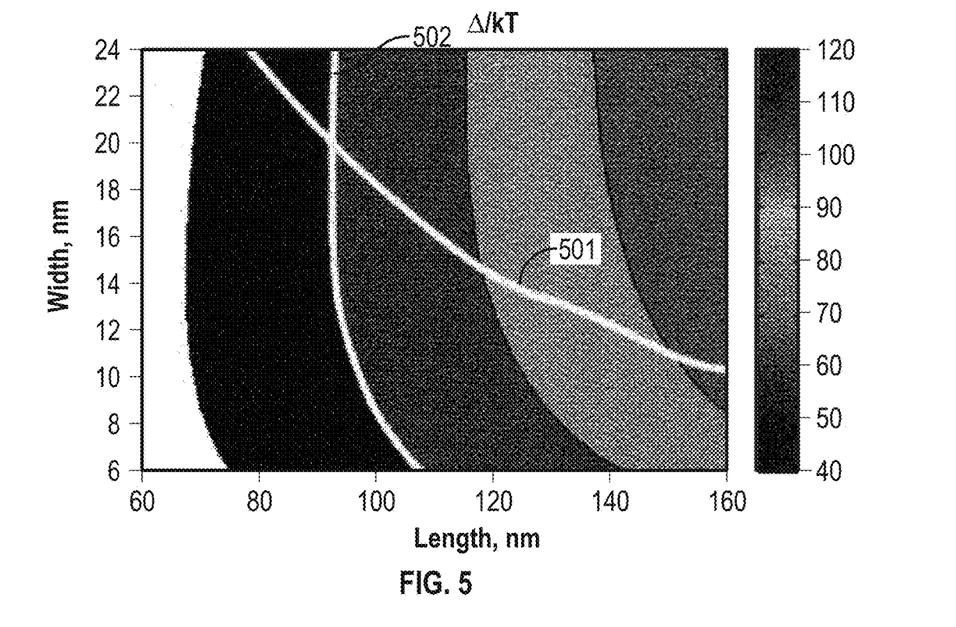
FIG. 5 addresses stability and critical current in an embodiment of the invention.

An embodiment includes a rectangular nanomagnet with rounded corners and length 405 of 128 nm, width 404 of 18 nm, and thickness of 2.5 nm. Of course other embodiments are not so limited and may include lengths of 100, 110, 120, 130, 140 nm and the like, along with a width of 5, 10, 15, 20, 25, 30 nm and the like, and a thickness of 1, 2, 3, 4, 5 nm and the like. The exact combination of such dimensions may be guided by, for example, FIG. 5, which addresses stability and critical current in an embodiment of the invention. Line 502 shows a demarcation between acceptable stability (e.g., greater than or equal to 48 kT, where T=temperature and k=Boltzmann constant) to the right of line 502 and unacceptable stability to the left of line 502.

Line 501 shows a demarcation between acceptable critical current (needed to switch free layer polarity) above line 501 and unacceptable critical current below line 501. Thus, the 128×18×2.5 embodiment with a corner having a radius of curvature between 6 and 18 nm falls clearly within the upper right section of FIG. 5, which indicates the embodiment properly balances performance (i.e., acceptable switching current and stability) and manufacturability.

Figure 6:
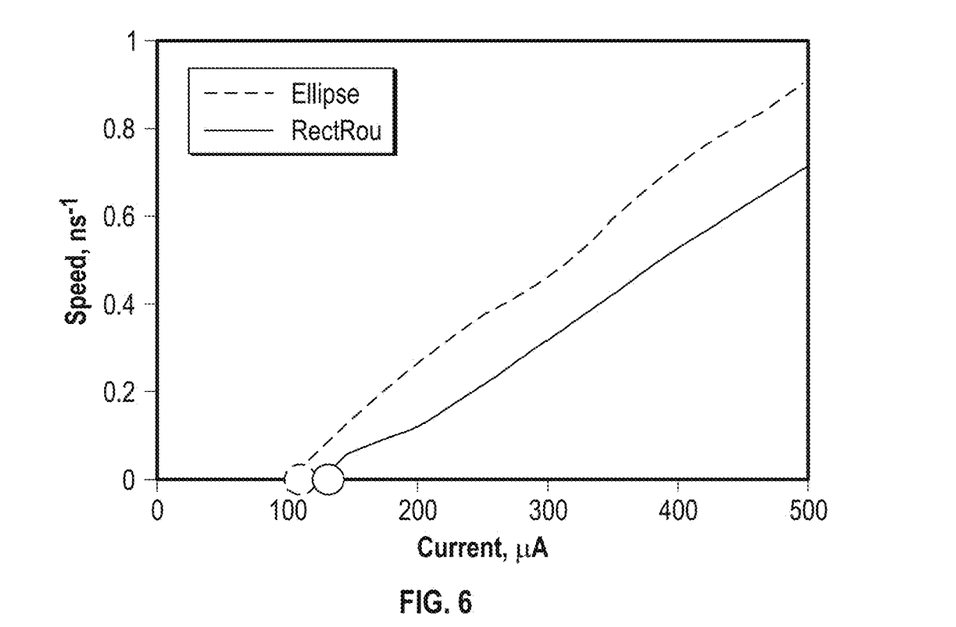
FIG. 6 addresses critical current in an embodiment of the invention.

FIG. 6 addresses critical current in an embodiment of the invention. More specifically, FIG. 6 illustrates dependence of switching speed on applied current for elliptic and rectangular nanomagnets. Unfilled circles denote critical currents for each case. For example, critical switching currents are for the ellipse=110 uA and for the rectangle with rounded corners=130 uA. As current increases to generate faster switching speed (switch speed increases as one proceeds up the Y axis of FIG. 6) the differential in switch speed between elliptical and rectangular free layer with rounded corners is fairly consistent and indicates acceptable operation for the rectangular free layer with rounded corners.

Figure 7:
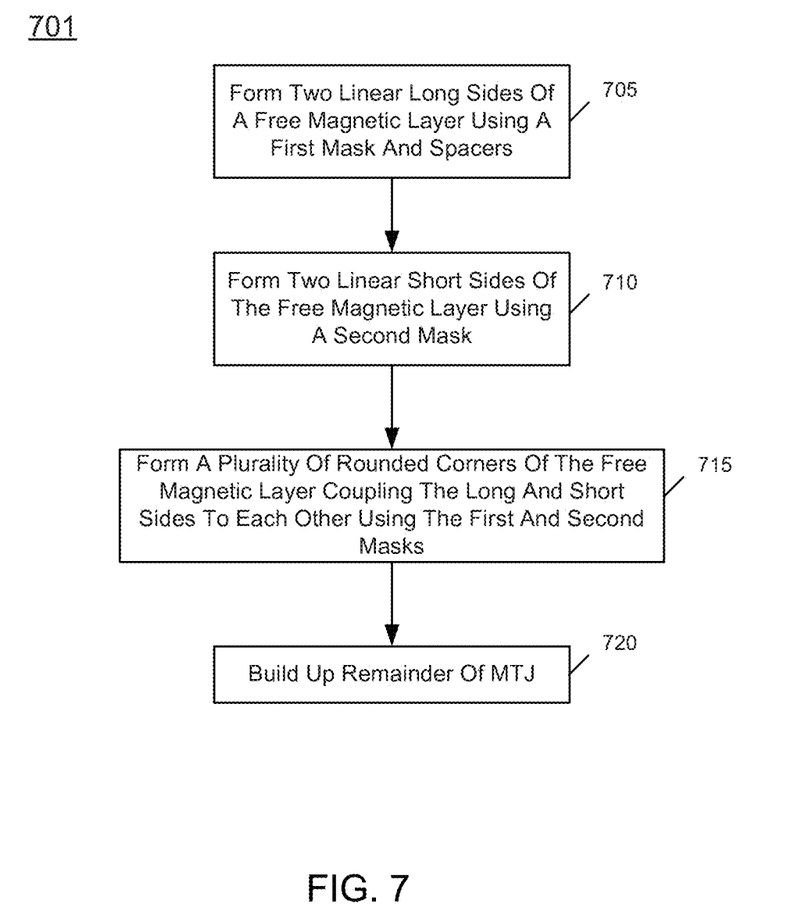
FIG. 7 depicts a method of forming a MTJ in an embodiment of the invention.

FIG. 7 depicts a method 701 of forming a memory in an embodiment of the invention. Block 705 includes forming two linear long sides of a free magnetic layer, generally parallel to a long axis for a MTJ including the long sides, using a first mask. In an embodiment the sides may be formed between two spacers. In an embodiment the width (e.g., width 404) between the two sides may be equal to the critical dimension of the lithography technique used to form the sides. In an embodiment the two linear long sides directly contact the two spacers. Due to use of the spacers, or other sub-pitch technique, the two linear long sides may be closer to one another than a minimum pitch for the lithography method.

Block 710 includes forming two linear short sides of the free magnetic layer, generally parallel to a short axis of the MTJ, using a second mask. This second mask may be a "cut mask" used to trim the two linear long sides and form the short sides in the process. Block 715 includes forming a plurality of rounded corners of the free magnetic layer coupling the long and short sides to each other using the first and second masks. This may occur as a result of the use of the first and second masks, depending on the resolution of those masks (i.e., when the cut mask is used to cut the long sides rounded corners may be produced based on the resolution of the lithography method being used). In other words, the method may include forming the plurality of rounded corners using the first and second masks and no other masks. However, in other embodiments a third mask (or additional mask) may be used to form the rounded corners (although doing so would still be "based on" the first and second masks that precede the use of the third mask). Block 720 includes building up the remainder of the MTJ, including a tunnel barrier and a fixed layer.

While several embodiments include fixed and free layers comprising CoFe other embodiments may include CoFeB, Ta, NiFe, and the like. Further, embodiments may include tunnel barriers having something other than MgO, such as other oxides.

Figure 8:
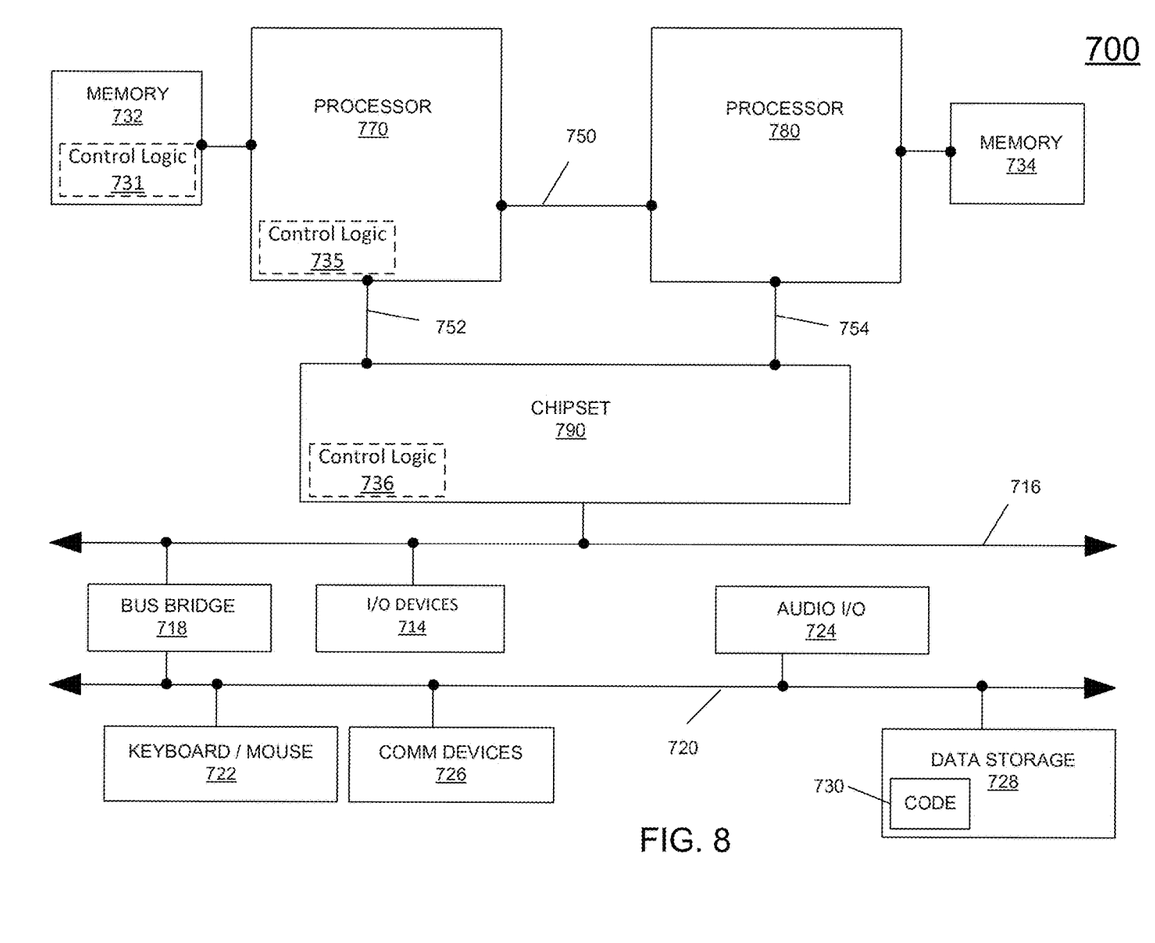
FIG. 8 depicts a system for use with embodiments of the invention.

Embodiments may be used in many different types of systems. For example, in one embodiment a communication device (e.g., cell phone, mobile computing node, Smartphone, netbook, notebook, personal computer, watch, and camera) can be arranged to include various embodiments described herein. Referring now to FIG. 8, shown is a block diagram of a system in accordance with an embodiment of the present invention. Multiprocessor system 700 is a point-to-point interconnect system, and includes a first processor 770 and a second processor 780 coupled via a point-to-point interconnect 750. Each of processors 770 and 780 may be multicore processors including, for example, embedded non-volatile memory utilizing magnets and spin-based memory described herein. First processor 770 may include a memory controller hub (MCH) and point-to-point (P-P) interfaces. Similarly, second processor 780 may include a MCH and P-P interfaces. The MCHs may couple the processors to respective memories, namely memory 732 and memory 734, which may be portions of main memory (e.g., a dynamic random access memory (DRAM) or spin-based described herein) locally attached to the respective processors. However, the processors may be located on the same chip as memory described herein. First processor 770 and second processor 780 may be coupled to a chipset 790 via P-P interconnects, respectively. Chipset 790 may include P-P interfaces. Furthermore, chipset 790 may be coupled to a first bus 799 via an interface. Various input/output (I/O) devices 714 may be coupled to first bus 799, along with a bus bridge 718, which couples first bus 799 to a second bus 798. Chipset 790 may also include magnets and spin-based memory described herein. Various devices may be coupled to second bus 798 including, for example, a keyboard/mouse 722, communication devices 797, and data storage unit 728 such as a disk drive or other mass storage device (which may or may not use magnets and spin-based memory described herein), which may include code 730, in one embodiment. Code may be included in one or more memories including memory 728, 732, 734, memory coupled to system 700 via a network, and the like. Further, an audio I/O 724 may be coupled to second bus 798.

As used herein a processor or controller, chipset, or memory may include control logic intended to represent any of a wide variety of control logic known in the art and, as such, may well be implemented as a microprocessor, a micro-controller, a field-programmable gate array (FPGA), application specific integrated circuit (ASIC), programmable logic device (PLD), firmware, software, and the like. In some implementations, control logic 731, 735, 736 and the like are intended to represent content (e.g., software instructions, etc.), which when executed cause a system to perform a method (e.g., accessing memory).

The following examples pertain to further embodiments.

An example includes an apparatus comprising: a magnetic tunnel junction (MTJ) including a free magnetic layer, a fixed magnetic layer, and a tunnel barrier between the free and fixed layers; wherein the free magnetic layer includes a top surface, a bottom surface, and a sidewall circumnavigating the free magnetic layer and coupling the bottom surface to the top surface; wherein the top surface is rectangular with a plurality of rounded corners.

Again, as mentioned above, a "rounded corner" used herein is to be interpreted in light of a semiconductor processing context where a rounded corner may not be entirely smooth. A radius of curvature may connect the tips of several jogs or steps as indicated in 411 of FIG. 4 (see dashed line 499 showing where radius of curvature is determined).

In another example, the subject matter of the previous examples can optionally include wherein the top surface includes: a long axis and a short axis orthogonal to the long axis; two linear long sides generally parallel to the long axis; and two linear short sides generally parallel to the short axis.

The "long sides" may be portions of sides. For example, as shown in profile 403 there is a linear portion extending along distance 406, but which is only a portion of what may be considered the side defined by length 405.

In another example, the subject matter of the previous examples can optionally include a width extending from one of the two long sides to another of the two long sides and parallel to the short axis; and a length extending from one of the two short sides to another of the two short sides and parallel to the long axis; wherein an aspect ratio of the length to the width is between 3:1 and 8:1.

Another example uses a lower aspect ratio, such as 2:1 (or between 2:1 and 4:1 such as 2.3:1 or 2.7:1 and the like), based on the use of a material in the free layer such as a Heusler alloy. Having "enough aspect ratio" (or a high enough ratio of length to width) helps promote magnetic state stability against thermal noise that may affect long term data storage (e.g., 1 day, 1 week, 1 year or more).

In another example, the subject matter of the previous examples can optionally include wherein one of the plurality of rounded corners includes a radius of curvature between 6 and 18 nm.

In another example, the subject matter of the previous examples can optionally include wherein the MTJ couples a bit line to a selection switch and a word line.

In another example, the subject matter of the previous examples can optionally include wherein the width is equal to a critical dimension for the apparatus.

In another example, the subject matter of the previous examples can optionally include an interconnect line having a line width, extending between and orthogonal to two sidewalls of the line, equal to the width.

In another example, the subject matter of the previous examples can optionally include a fin coupled to a substrate and having a fin width, extending between and orthogonal to two sidewalls of the fin, equal to the width.

In another example, the subject matter of the previous examples can optionally include wherein the length is less than 130 nm, the width is less than 25 nm, and a thickness for the free magnetic layer is less than 4 nm.

In another example, the subject matter of the previous examples can optionally include wherein the free magnetic layer includes (a) a stability factor greater than 70 kT, where T=temperature and k=Boltzmann constant, and (b) a critical switching current less than 150 μA.

In another example, the subject matter of the previous examples can optionally include a switching current of less than 150 μA.

In another example, the subject matter of the previous examples can optionally include a spin torque transfer memory (STTM) that includes the MTJ.

In another example, the subject matter of the previous examples can optionally include wherein the free layer changes magnetization direction along the long axis based on polarization of driving current passed to the free layer.

In another example, the subject matter of the previous examples can optionally include wherein (a) a rounded corner directly connects to one of the two long sides and one of the two short sides, (b) the two linear short sides are each at least 25% as long as a width extending from one of the two long sides to another of the two long sides, and (c) and the two linear long sides are each at least one 50% as long as a length extending from one of the two short sides to another of the two short sides.

Other embodiments provide the two linear short sides are each at least 15, 35, 45% as long as a width extending from one of the two long sides to another of the two long sides, and the two linear long sides are each at least 30, 40, 60, 70, 80, 90% as long as a length extending from one of the two short sides to another of the two short sides.

Another example includes a lithography method comprising: forming a magnetic tunnel junction (MTJ) on a substrate, the MTJ including a non-elliptical free magnetic layer, a fixed magnetic layer, and a tunnel barrier layer between the free and fixed layers, the free magnetic layer including a long axis orthogonal to a short axis; forming two linear long sides of the free magnetic layer, generally parallel to the long axis, using a first mask; forming two linear short sides of the free magnetic layer, generally parallel to the short axis, using a second mask; and forming a plurality of rounded corners of the free magnetic layer coupling the long and short sides to each other using the first and second masks.

A non-elliptical free magnetic layer may include a rectangular free layer with rounded corners and an aspect ratio between 4:1 and 8:1.

In another example, the subject matter of the previous examples can optionally include forming the plurality of rounded corners using the first and second masks and no other masks.

In another example, the subject matter of the previous examples can optionally include forming the two linear long sides between two spacers.

In another example, the subject matter of the previous examples can optionally include wherein the two linear long sides directly contact the two spacers.

In another example, the subject matter of the previous examples can optionally include wherein the two linear long sides are closer to one another than a minimum pitch for the lithography method.

Another example, includes an apparatus comprising: a magnetic tunnel junction (MTJ) including a free magnetic layer, a fixed magnetic layer, and a tunnel barrier between the free and fixed layers: wherein the free magnetic layer (a) includes a length-to-width ratio between 3:1 and 9:1, (b) is non-elliptical, and (c) has a top surface with two opposing linear side portions that are parallel to a long axis of the top surface.

A ratio between 3:1 and 9:1 may include 3:1, 4:1, 5:1, 6:1, 7:1, 8:1, 9:1 and points in between. A linear side portion may be like the portion 406, included along the side defined by dimension 405.

In another example, the subject matter of the previous examples can optionally include wherein one of the linear side portions connects to a rounded corner that includes a radius of curvature between 6 and 18 nm.

In another example, the subject matter of the previous examples can optionally include a width orthogonal to the two linear side portions and extending from one of the two linear side portions to another of the two linear side portions; wherein the width is equal to a critical dimension for the apparatus.

In another example, the subject matter of the previous examples can optionally include a width orthogonal to the two linear side portions and extending from one of the two linear side portions to another of the two linear side portions; wherein the width is no greater than a maximum width between two sidewalls of a fin included in the apparatus.

In another example, the subject matter of the previous examples can optionally include a width orthogonal to the two linear side portions and extending from one of the two linear side portions to another of the two linear side portions; and a length orthogonal to the width and extending from one end of the free magnet layer to another end of the free magnet layer; wherein the two linear side portions are each at least 50% as long as the length.

In another example, the subject matter of the previous examples can optionally include a rounded corner connecting a lateral edge of the top surface to one of the two opposing linear side portions, wherein the rounded corner has a consistent radius of curvature from the edge to the one of the two opposing linear side portions.

Thus, in an embodiment there is a single radius of curvature for all the corners. However, in other embodiments a single corner may have a varying radius of curvature (i.e., radii of curvature). In one embodiment the radii of curvature for a single "corner" makes the device more elliptical. In an embodiment, if one construed an ellipse to have a rounded corner any such "rounded corner" would have a varying radius of curvature that is larger near the near the midpoint of dimension 408 and smaller (sharper) near dimension 410.

Another embodiment includes an apparatus comprising: a magnetic tunnel junction (MTJ) including a free magnetic layer, a fixed magnetic layer, and a tunnel barrier between the free and fixed layers; wherein the free magnetic layer includes a top surface, a bottom surface, and a sidewall circumnavigating the free magnetic layer and coupling the bottom surface to the top surface; wherein the top surface is rectangular with a plurality of rounded corners. One of the rounded corners may have a varying radius of curvature. Other embodiments may provide that one of the rounded corners has a consistent non-varying radius of curvature throughout the corner.

The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. An apparatus comprising:
    a magnetic tunnel junction (MTJ) including a free magnetic layer, a fixed magnetic layer, and a tunnel barrier between the free and fixed layers; and
    a fin of a finFET, the fin being coupled to a substrate;
    wherein the free magnetic layer includes a top surface, a bottom surface, and a sidewall circumnavigating the free magnetic layer and coupling the bottom surface to the top surface;

wherein the top surface is rectangular with a plurality of rounded corners;

wherein the top surface includes: (a)(i) a long axis and a short axis, (a)(ii) the short axis is orthogonal to the long axis, (a)(iii) two linear long sides generally parallel to the long axis, and (a)(iv) two linear short sides generally parallel to the short axis;

wherein: (b)(i) a width extends from one of the two linear long sides to another of the two linear long sides, (b)(ii) the width is parallel to the short axis, (b)(iii) a length extends from one of the two linear short sides to another of the two linear short sides, and (b)(iv) the length is parallel to the long axis;

wherein: (c)(i) the fin has opposing sidewalls, (c)(ii) the fin has a fin width, (c)(iii) the fin width includes a maximum width between the opposing sidewalls, and (c)(iv) the fin width is substantially equal to the width.

2. The apparatus of claim 1, wherein an aspect ratio of the length to the width is between 3:1 and 8:1.

3. The apparatus of claim 2, wherein one of the plurality of rounded corners includes a radius of curvature between 6 and 18 nm.

4. The apparatus of claim 2, wherein the MTJ couples a bit line to a selection switch and a word line.

5. The apparatus of claim 2 wherein the width is equal to a critical dimension for the apparatus.

6. The apparatus of claim 2 including an interconnect line having a line width, extending between and orthogonal to two sidewalls of the line, equal to the width.

7. The apparatus of claim 2 wherein the length is less than 130 nm, the width is less than 25 nm, and a thickness for the free magnetic layer is less than 4 nm.

8. The apparatus of claim 2, wherein the free magnetic layer includes (a) a stability factor greater than 70 kT, where T=temperature and k=Boltzmann constant, and (b) a critical switching current less than 150 µA.

9. The apparatus of claim 8 comprising a switching current of less than 150 µA.

10. The apparatus of claim 1, wherein (a) a rounded corner directly connects to one of the two linear long sides and one of the two linear short sides, (b) the two linear short sides are each at least 25% as long as the width, and (c) the two linear long sides are each at least 50% as long as the length.

11. The apparatus of claim 1 wherein the free layer changes magnetization direction along the long axis based on polarization of driving current passed to the free layer.

12. The apparatus of claim 1 comprising a spin torque transfer memory (STTM) that includes the MTJ.

13. An apparatus comprising:
a magnetic tunnel junction (MTJ) including a free magnetic layer, a fixed magnetic layer, and a tunnel barrier between the free and fixed layers; and
a fin of a finFET;
wherein the free magnetic layer (a) includes a length-to-width ratio between 3:1 and 9:1, (b) is non-elliptical, and (c) has a top surface with two opposing linear side portions that are parallel to a long axis of the top surface;
wherein the free magnetic layer includes a width orthogonal to the two linear side portions and extending from one of the two linear side portions to another of the two linear side portions;
wherein the width is no greater than a maximum width between two sidewalls of the fin.

14. The apparatus of claim 13, wherein one of the linear side portions connects to a rounded corner that includes a radius of curvature between 6 and 18 nm.

15. The apparatus of claim 13 wherein the width is equal to a critical dimension for the apparatus.

16. The apparatus of claim 13, comprising:
a length orthogonal to the width and extending from one end of the free magnetic layer to another end of the free magnetic layer;
wherein the two linear side portions are each at least 50% as long as the length.

17. The apparatus of claim 13 comprising a selection switch configured to select the MTJ, wherein the selection switch includes the finFET.

18. The apparatus of claim 1 comprising a selection switch configured to select the MTJ, wherein the selection switch includes the finFET.

* * * * *